United States Patent
Kim et al.

(10) Patent No.: US 10,356,895 B2
(45) Date of Patent: Jul. 16, 2019

(54) FLEXIBLE CIRCUIT BOARD HAVING ENHANCED BENDING DURABILITY AND METHOD FOR PREPARING SAME

(71) Applicant: GigaLane Co., Ltd., Hwaseong-si (KR)

(72) Inventors: Sang Pil Kim, Hwaseong-si (KR); Da Yeon Lee, Hwaseong-si (KR); Hwang Sub Koo, Hwaseong-si (KR); Hyun Je Kim, Hwaseong-si (KR); Hee Seok Jung, Hwaseong-si (KR)

(73) Assignee: GIGALANE CO., LTD., Hwaseong-si (KR)

( * ) Notice: Subject to any disclaimer, the term of this patent is extended or adjusted under 35 U.S.C. 154(b) by 0 days.

(21) Appl. No.: 15/923,070

(22) Filed: Mar. 16, 2018

(65) Prior Publication Data
US 2018/0206335 A1    Jul. 19, 2018

Related U.S. Application Data

(63) Continuation of application No. PCT/KR2016/007593, filed on Jul. 13, 2016.

(30) Foreign Application Priority Data

Sep. 24, 2015   (KR) .......................... 10-2015-0135422

(51) Int. Cl.
*H05K 1/02*    (2006.01)
*H05K 3/28*    (2006.01)
(Continued)

(52) U.S. Cl.
CPC ......... *H05K 1/0281* (2013.01); *H05K 1/0242* (2013.01); *H05K 1/115* (2013.01);
(Continued)

(58) Field of Classification Search
CPC .... H05K 1/0281; H05K 1/0242; H05K 1/115; H05K 3/0026; H05K 3/06; H05K 3/28; H05K 1/02
(Continued)

(56) References Cited

U.S. PATENT DOCUMENTS 5,418,504 A    5/1995   Nottenburg
5,982,249 A    11/1999  Bruns
(Continued)

FOREIGN PATENT DOCUMENTS

JP    2014-082455    5/2014

OTHER PUBLICATIONS

KIPO, Written Opinion of Application No. PCT/KR2016/007593, dated Oct. 19, 2016.

*Primary Examiner* — Tremesha S Willis
(74) *Attorney, Agent, or Firm* — Brundidge & Stanger, P.C.

(57) ABSTRACT

A flexible circuit board having enhanced bending durability and a method for preparing same are provided. The method comprises: forming a signal line and a first ground layer on a first dielectric body and forming a second ground layer on a bottom side of the first dielectric body; preparing a second dielectric body; preparing a first bonding sheet and a first protective sheet which is connected to one end of the first bonding sheet or of which one or more parts are overlapped on one end of the first bonding sheet; bonding the second dielectric body onto the first dielectric body by means of the first bonding sheet; forming a via hole such that the first ground layer and the second ground layer are conducted; and cutting in a width direction the second dielectric body placed on the first protective sheet.

6 Claims, 8 Drawing Sheets

(51) Int. Cl.
  *H05K 1/11*    (2006.01)
  *H05K 3/00*    (2006.01)
  *H05K 3/06*    (2006.01)
  *H05K 3/40*    (2006.01)
  *H05K 3/46*    (2006.01)

(52) U.S. Cl.
  CPC ......... *H05K 3/0026* (2013.01); *H05K 3/0044* (2013.01); *H05K 3/06* (2013.01); *H05K 3/28* (2013.01); *H05K 3/4038* (2013.01); *H05K 3/4644* (2013.01); *H05K 1/024* (2013.01); *H05K 1/0219* (2013.01); *H05K 3/0038* (2013.01); *H05K 2201/093* (2013.01); *H05K 2201/09845* (2013.01); *H05K 2203/0228* (2013.01); *H05K 2203/107* (2013.01)

(58) Field of Classification Search
  USPC ........................................................ 174/254
  See application file for complete search history.

(56)            References Cited

U.S. PATENT DOCUMENTS

2009/0133906 A1   5/2009  Baek
  2014/0017940 A1   1/2014  Chen et al.

FLEXIBLE CIRCUIT BOARD HAVING ENHANCED BENDING DURABILITY AND METHOD FOR PREPARING SAME

CROSS-REFERENCES TO RELATED APPLICATION

This application is a Continuation Application of PCT Patent Application No. application of PCT/KR2016/007593 filed on Jul. 13, 2016, which claims priority to Korean Patent Application No. 10-2015-0135422 filed on Sep. 24, 2015, the contents of which are incorporated herein by reference.

TECHNICAL FIELD

The invention related to flexible circuit board having enhanced bending durability and the manufacturing method thereof.

BACKGROUND

Wireless terminal such as mobile phone comprises RF (Radio Frequency) signal line. The RF signal line is normally made of coaxial cable. Such RF signal line made of coaxial cable makes the inner space of the wireless terminal narrower so that flexible circuit board generally applied to the wireless terminal nowadays.

Wireless terminal such as mobile phone comprises RF (Radio Frequency) signal line. The RF signal line is normally made of coaxial cable. Such RF signal line made of coaxial cable makes the inner space of the wireless terminal narrower so that flexible circuit board generally applied to the wireless terminal nowadays.

In the case of traditional flexible circuit board, it is possible that flexible circuit board is apt to be fracture or broke down in the part of repeatedly bending such as folding type handset. In order to overcome such a problem, the thickness of the flexible circuit board changes by providing with a dielectric with only a certain section in the longitudinal direction. In this case, a method of cutting the dielectric by a blade, a laser or the like is used to make the dielectric exist only in a predetermined section.

However, when the dielectric is cut, a part of the signal line and the ground surface is also cut and damaged, so that the signal transmission efficiency is lowered. Therefore, the damaged part thereof is cut off due to repeatedly bending.

In addition, a common method of cutting with a laser beam causes carbide to be formed on a signal line and a ground, so that a signal line and a ground are connected electrically, or signal transmission efficiency is lowered.

On the other hand, flexible circuit board makes sure of the necessary amount of signals by the means of increasing the size of signal line, decreasing line loss at signal transmission through thicken the signal line, or decreasing the signal loss of reflection by shielding the external environmental signals from outside.

Flexible circuit board has optimum impedance of about 33Ω at the signal transmitter, and optimum impedance of about 75Ω at the signal receiver. Considering both the transmitter and receiver, it is ordinary that flexible circuit board should be designed to have characteristic impedance of about 50Ω.

In the case that external environmental signals are introduced from other outside components, the characteristic impedance would be deviated from the normal level of 50Ω, so that the signal transmission efficiency might be aggravated.

Therefore, flexible circuit board should be applied at the reasonably separated location from other components so as to prevent unwanted impedance variation. In this case, however, the inner space of the terminal, which is the main merit and advantage of flexible circuit board, may be narrower.

Flexible circuit board may be placed near other components by the impedance matching. But, in this case, the shape of flexible circuit board should be changed as well, according to the variation of shape or location of at least one component among its main board, sub board, battery or so. Therefore, it is necessary that the flexible circuit board can be installed freely inside of the wireless terminal without effect of other components thereof.

The background described herein will be understood only for the purposes of understanding of background of the invention, so that said background should not be accepted the prior art of the invention in the view of the person having ordinary skilled in the art.

DETAILED DESCRIPTION OF THE INVENTION

Technical Problems

The invention may provide the enhanced bending durable flexible circuit board and the manufacturing method thereof, which can be installed in the terminal without locational limit, enhance the bending durability, and prevent some damages of signal line and ground line thereof.

SUMMARY OF THE INVENTION

For the purposes above-mentioned, a method of manufacturing flexible circuit board having enhanced bending durability according to an embodiment of the invention, the method comprises, (a) forming a signal line and a first ground layer on a first dielectric, and forming a second ground layer on the bottom surface of the first dielectric, (b) preparing a second dielectric, (c) preparing a first bonding sheet and a first protective sheet connected to one end of the first bonding sheet or positioned so as to overlap at least a part thereof, (d) bonding the second dielectric on the first dielectric via the first bonding sheet, (e) forming a via hole so that the first ground layer and the second ground layer can be connected electrically, and (f) cutting the second dielectric on the first protective sheet in the width direction.

The method of an embodiment may further comprise, (b-1) preparing a third dielectric, (c-1) preparing a second bonding sheet and a second protective sheet connected to one end of the second bonding sheet or positioned so as to overlap at least a part thereof, (d-1) bonding the third dielectric on the bottom surface of the first dielectric via the second bonding sheet, and (f-1) cutting the third dielectric located under the second protective sheet in the width direction.

An embodiment of the invention may further comprise, (e-1) Forming a third ground layer and a fourth ground layer on the second dielectric and a third dielectric respectively.

In an embodiment of the invention, at least one of the first protective sheet and the second protective sheet may be made of any one material selected from a poly-based resin and an epoxy-based resin.

In an embodiment of the invention, in the step (a), the signal line, the first ground layer, and the second ground layer may be formed by wet etching the upper and lower metal layers of the first dielectric, and the first ground layer is spaced apart from the signal line by a predetermined distance, and the second ground layer is formed in a shape corresponding to the first ground layer.

In an embodiment of the invention, the first bonding sheet is provided with an inner space forming groove on a surface facing the signal line so that the signal line is exposed to air layer.

In an embodiment of the invention, a flexible circuit board having enhanced bending durability comprises, a first substrate part including a first dielectric, a second dielectric facing the upper surface of the first dielectric, a first ground layer stacked on the first dielectric, and a third ground layer stacked on the second dielectric; a second substrate part extending from one end of the first substrate part and excluding the third ground layer from the first substrate part so that the second substrate part may be thinner than the first substrate part; a third substrate part extending from one end of the second substrate part and excluding the second dielectric from the second substrate part so that the third substrate part is thinner than the second substrate part; a first bonding sheet bonding the first ground layer and the second dielectric; and a first protective sheet interposed between the second dielectric and the first ground layer to connect to the one end of the first bonding sheet or overlap at least a part of the first bonding sheet, and the other end of the first protective sheet protruding further in the signal line direction than the one end of the second dielectric.

In an embodiment of the invention, the first substrate part further may comprise a third dielectric facing the bottom surface of the first dielectric, a fourth ground layer stacked on the bottom surface of the third dielectric, and a second ground layer stacked on the bottom surface of the first dielectric; the second substrate part formed by excluding the fourth ground layer from the first substrate part; the third substrate part formed by excluding the third dielectric from the second substrate part, and wherein the third substrate part further comprises a second bonding sheet for bonding the second ground layer and the third dielectric, and a second protective sheet connected to one end of the second bonding sheet or interposed between the third dielectric and the second ground layer such that at least a part of the second bonding sheet overlaps the other end of the second protective sheet protruding further in the signal line direction than the one of the third dielectric.

In an embodiment of the invention, a signal line may be provided on the first dielectric, a pair of the first bonding sheets form an inner space defined by the first dielectric, the second dielectric, and the first bonding sheet, being spaced apart from each other by a predetermined distance, and the signal line is located in the inner space.

In an embodiment of the invention, a via hole may be formed by passing through the first dielectric to the third dielectric, the first ground layer to the fourth ground layer, and the first bonding sheet to the second bonding sheet in order to conduct or electrically connected from the first ground layer to the fourth ground layer, and a plurality of ground holes may be formed and spaced apart from each other by a predetermined distance in the third ground layer.

In an embodiment of the invention, a gap between the second ground layer and the fourth ground layer may be larger than a gap between the first ground layer and the third ground layer.

In an embodiment of the invention, a flexible circuit board having enhanced bending durability may comprise, a first substrate part including a first dielectric and a second dielectric facing an upper surface of the first dielectric, and a second substrate part formed to be thinner than the first substrate part and including the first dielectric extending from the first substrate part, a first portion of the first dielectric is sandwiched between the first dielectric and the second dielectric, and a second portion of the first protective sheet extends along a direction in which the first dielectric extends.

In an embodiment of the invention, a flexible circuit board may further comprise, a third dielectric corresponding the second dielectric placing the first dielectric between the third dielectric and the second dielectric, and a second protective sheet having a portion of the second protective sheet interposing between the first dielectric and the third dielectric, the other portion of the second protective sheet extending along a direction in which the first dielectric extends.

In an embodiment of the invention, a flexible circuit board may further comprise a first substrate part having a first ground layer stacked on the first dielectric, a second ground layer stacked on the second dielectric corresponding to the first ground layer with the first dielectric as a center, a third ground layer stacked on the second dielectric, and a fourth ground layer stacked on the third dielectric.

In an embodiment of the invention, the third ground layer, the second dielectric, the first protective sheet, and the first ground layer are formed in a stepped structure, and the fourth ground layer, the third dielectric, the second protective sheet, and the second ground layer are formed in a stepped structure.

The details of embodiments of the invention are set forth in the accompanying drawings and the description below.

The terms and words used in this specifications and claims should not be interpreted by the means of ordinary, plain and dictionary meaning, instead that the terms and words therein should be interpreted according to the technical idea of the invention, by the principle of lexicographer.

The Effects of the Invention

The invention may have various effects as bellows;

Firstly, flexible circuit board may be placed anywhere inside the wireless terminal.

Secondly, the flexible circuit board may be much more bending durable.

Thirdly, the damages of signal line and ground may be prevented in the manufacturing process of the flexible circuit board.

DESCRIPTION OF MARK

100: first substrate part
200: second substrate part
300: third substrate part
400: first ground layer
500: second ground layer
510: line ground
520: mesh ground
600: third ground layer
700: fourth ground layer
800: signal line
810: first signal line
920: second signal line
B1: first bonding sheet
B2: second bonding sheet
C1: first protective sheet
C2: second protective sheet
E1: first dielectric
E2: second dielectric
E3: third dielectric
H: inner space forming groove
GH: ground hole
VH: via hole

DETAILED DESCRIPTION

The objects, specific advantages and novel features of the invention will become more apparent from the following detailed description and embodiments accompanying drawings. It should be noted that the reference numerals are added to the elements of the drawings in the specifications with the same numerals as possible, even if they are on other drawings.

Also, the terms "first", "second", etc. may be used to describe various elements, but the elements should not be limited by the terms. The terms are used only for the purpose of distinguishing one element from another. In the following description of the invention, a detailed description of publicly-known related arts will be omitted when it is determined that the spirit or gist of the invention may be unnecessarily obscured.

The flexible circuit board with improved bending durability according to an embodiment of the invention and its manufacturing method can prevent the impedance from being changed due to effects of any parts such as a main board, a sub-board, and a battery. The transmission line can be prevented from being damaged at the repeatedly bent, and the signal line and the ground can be prevented from being damaged in the manufacturing process as well.

Hereinafter, the embodiments of the invention, the manufacturing method of enhanced bending durable flexible circuit board, will be described in detail with reference to the accompanying drawings.

Figure 1:
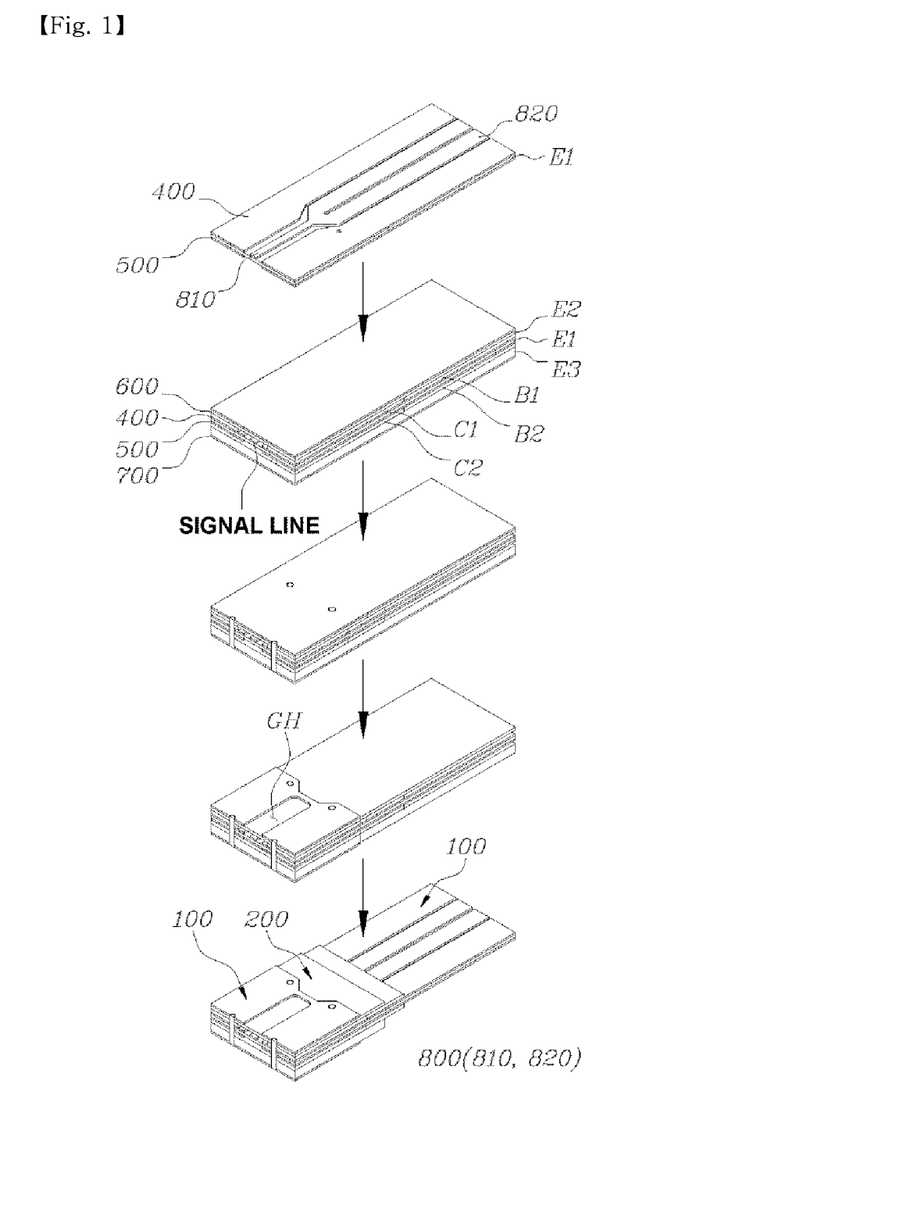
FIG. 1 is a schematic illustrating manufacturing process of flexible circuit board according to an embodiment of the invention.
Figure 2:
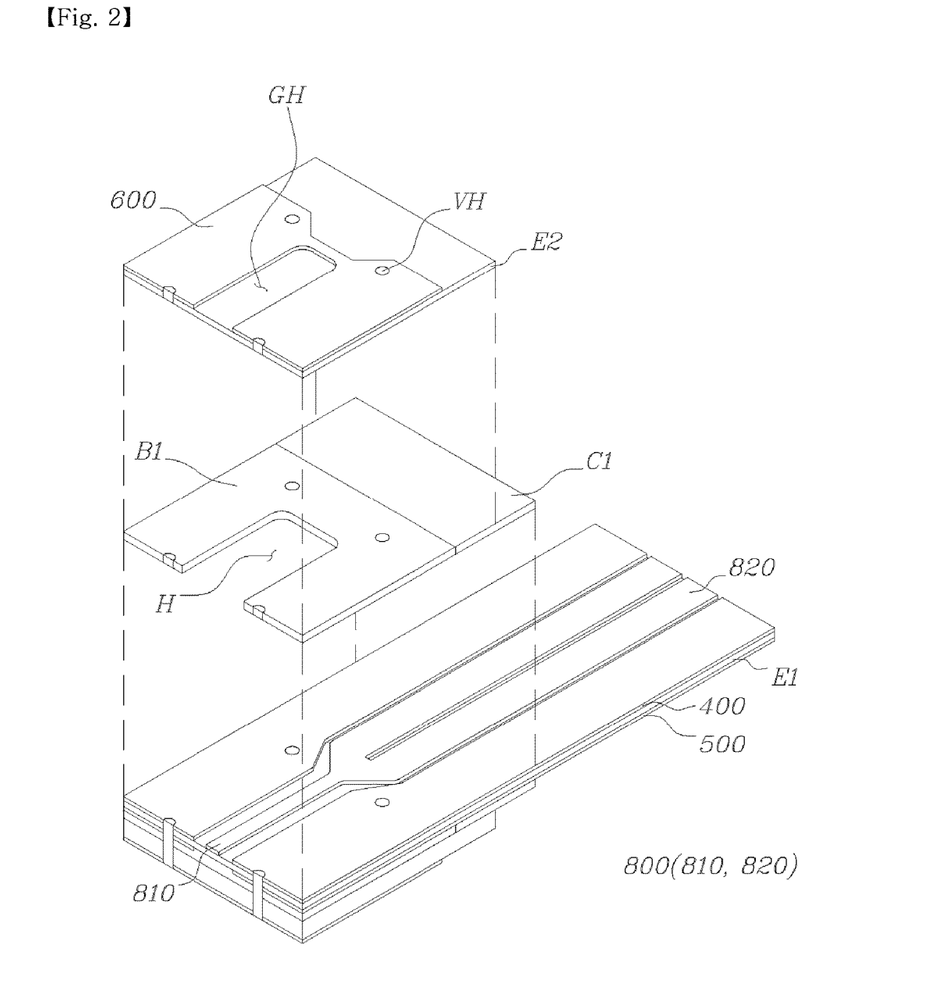
FIG. 2 is an illustrating an upper part of flexible circuit board according to an embodiment of the invention.
Figure 3:
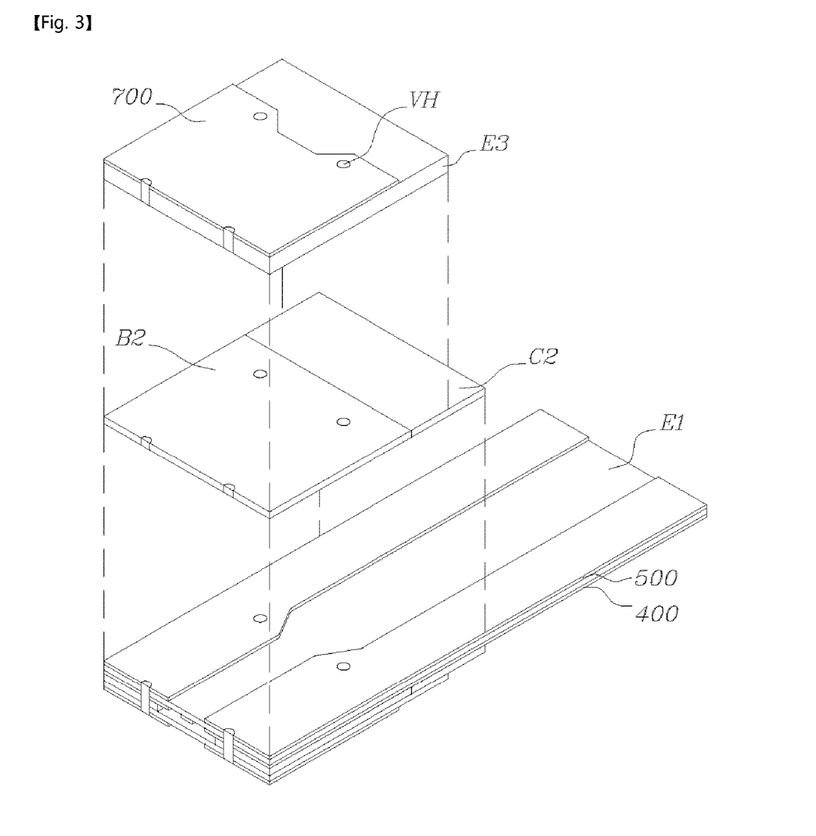
FIG. 3 is an illustrating a lower part of flexible circuit board according to an embodiment of the invention.

As shown in FIGS. 1 to 3, in order to manufacture a flexible circuit board with improved bending durability according to an embodiment of the invention, a first dielectric E1 is prepared, and a signal line 800 and a first ground layer 400 are formed on the upper surface of the first dielectric E1, and a second ground layer 500 is formed on the bottom surface of the first dielectric E1.

The signal line 800, the first ground layer 400 and the second ground layer 500 are formed by wet etching the metal layers existing on the upper surface and the bottom surface of the first dielectric E1. In this case, a pair of the first ground layers 400 is formed on both sides of the first dielectric E1 with the signal line 800 interposed therebetween. The signal line 800 is formed at a predetermined distance from both sides of the signal line 800 in parallel with the signal line 800. The second ground layer 500 is also formed on the bottom surface of the first dielectric E1 in the same manner and shape as the first ground layer 400.

After above process is completed, a second dielectric E2 to be staked on the upper surface of the first dielectric E1 and a third dielectric E3 to be deposited on the bottom surface of the first dielectric E1 are prepared. The first bonding sheet B1 and the second bonding sheet B2 are prepared so as to bond the second dielectric E2 and the third dielectric E3 to the first dielectric E1. At this time, the first bonding sheet B1 is for bonding the first dielectric E1 and the second dielectric E2, and the second bonding sheet B2 is for bonding the first dielectric E1 and the third dielectric E3

An inner space forming groove H is formed on a surface of the first bonding sheet B1 facing the signal line 800 so that an inner space having an air layer formed therein can be provided in the final product, that is the flexible circuit board having improved bending durability. In this case, it is preferable that the shape of the first bonding sheet B1 is a "☐" shape as a whole in order to prevent outside materials from inflowing through both ends thereof.

And then, a first protective sheet C1 and a second protective sheet C2 made of any one material selected from a poly-based resin or an epoxy-based resin are prepared. The first protective sheet C1 is connected to one end of the first bonding sheet B1 or at least partially overlapped the first bonding sheet B1, and the second protective sheet C1 is connected to one end of the second bonding sheet B2 or at least partially overlapped the second bonding sheet B2.

Also, the second dielectric E2 is placed on the upper surface of the first dielectric E1 by the first bonding sheet B1, and the third dielectric E3 is placed on the bottom surface of the first dielectric E1. The bottom surface of the first bonding sheet B1 is bonded to the upper surface of the first ground layer 400 formed on the upper surface of the first dielectric E1, and the bottom surface of the first protective sheet C1 faces to the upper surface of the first ground layer 400.

In addition, the upper surface of the second bonding sheet B2 is bonded to the bottom surface of the second ground layer 500 formed on the bottom surface of the first dielectric E1, and the upper surface of the second protective sheet C2 is facing to the second ground layer 500.

When the bonding process is completed as above described, the second dielectric E2 with metal layer thereon, the first bonding sheet B1, the first ground layer 400, the first dielectric E1, the second ground layer 500, the second bonding sheet B2 and a third dielectric E3 having a metal layer on the bottom thereof are machined or laser processed to form holes in the vertical direction, and fill the holes with conductive material to form via holes VH.

After the via holes VH are formed, the metal layer of the second dielectric E2 and the third dielectric E3 is wet-etched to form a third ground layer 600 on the upper surface of the second dielectric E2, and a fourth ground layer 700 is formed on the bottom surface of the third dielectric E3. Thereafter, the second dielectric E2 on the first protective sheet C1 is cut in the width direction, and the third dielectric E3 under the second protective sheet C2 is cut in the width direction to complete final products. The first and second protective sheets C1 and C2 prevent carbide formation and damages to the signal line 800, the first ground layer 400 and the second ground layer 500 during cutting.

Hereinafter, the embodiments of enhanced bending durable flexible circuit board manufactured by the method herein will be described in detail with reference to the accompanying drawings.

Figure 4:
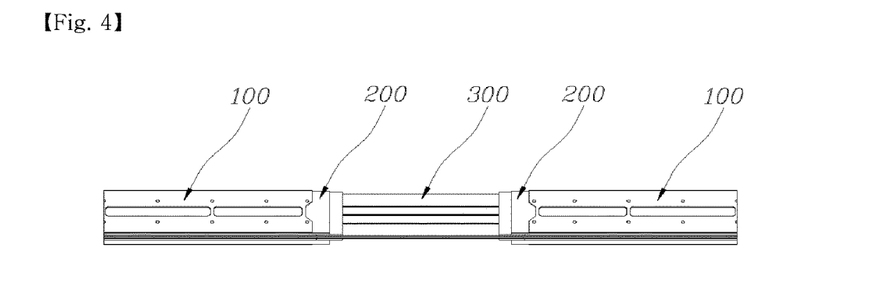
FIG. 4 is a schematic illustrating a structure of flexible circuit board according to an embodiment of the invention.
Figure 5:
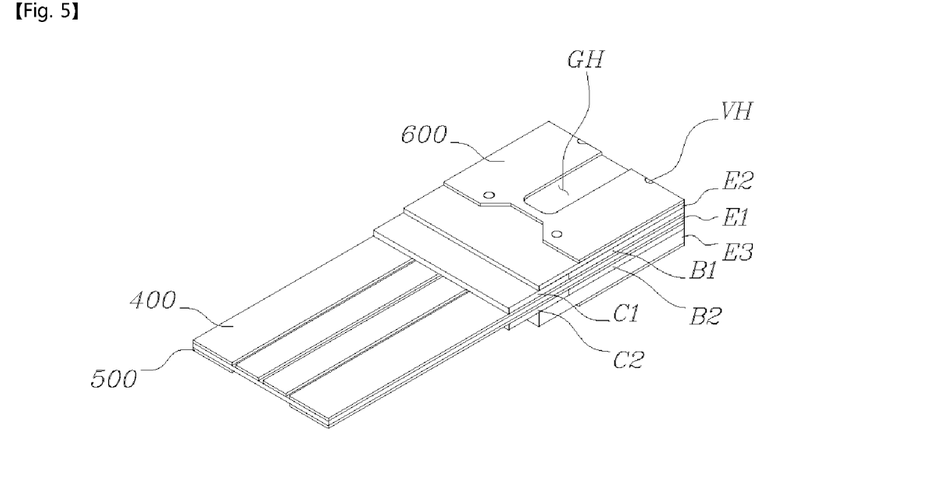
FIG. 5 is a perspective view of a part of the configuration from FIG. 4.
Figure 6:
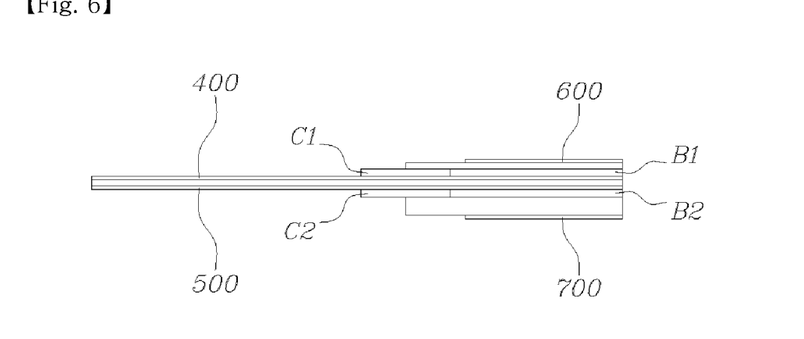
FIG. 6 is a side view of FIG. 5.

According to FIGS. 4 to 6, flexible circuit board having improved bending durability may include a first substrate part 100, a second substrate part 200, and a third substrate part (300). The thicknesses of the first substrate part 100, the second substrate part 200, and the third substrate part 300 are sequentially decreased.

The second substrate part 200 is formed to extend from one end of the first substrate part 100, and is formed to be thinner than the first substrate part 100. The third substrate part 300 is formed to extend from one end of the second substrate part 200 to be thinner than the second substrate part 200.

The third substrate part 300 may be a section where bending occurs repeatedly in the wireless terminal. When the third substrate part 300 is directly extended from the first substrate part 100, stress may be concentrated to the connection between the first substrate part 100 and the third substrate part 300, so that the connection is apt to be broke. Accordingly, the inventors introduce "sequential thickness variation" to the embodiment. That is, the "sequential thickness variation" is the connection between the first substrate part 100 and the second substrate part 200 via the second substrate part 200, which is thinner than the first substrate part 100 and thicker than the third substrate part 300.

Figure 7:
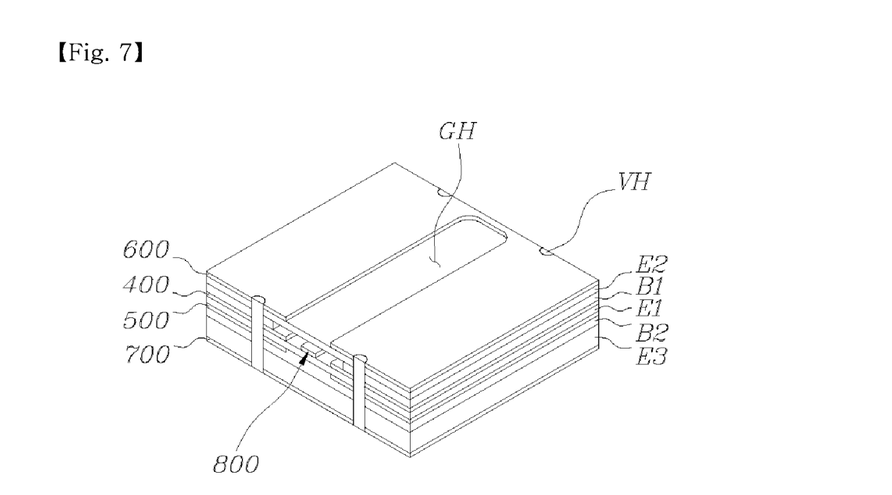
FIG. 7 is a perspective view of a flexible circuit board according to an embodiment of the invention.
Figure 8:
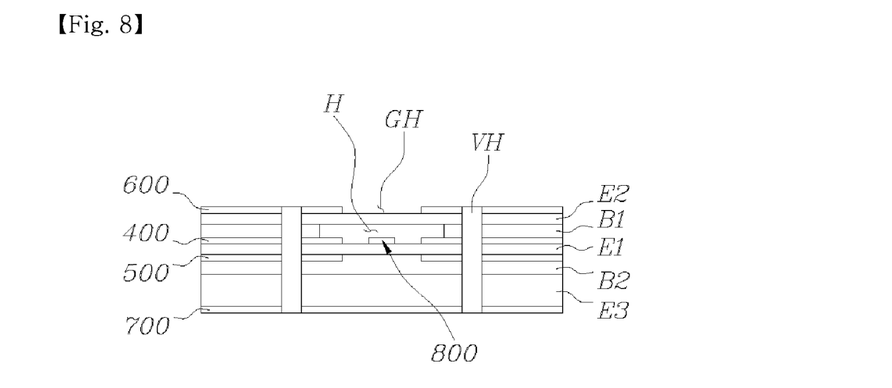
FIG. 8 is a cross-sectional view of a flexible circuit board according to an embodiment of the invention.

As shown in FIGS. 7 and 8, the first substrate part 100 of the flexible circuit board, with enhanced bending durability according to an embodiment of the invention, may include a first dielectric E1, a second dielectric E2, a third dielectric E3, a first ground layer 400, a second ground layer 500, a third ground layer 600, a fourth ground layer 700, and a via hole VH. That is, the first substrate part 100 may have a three-layered dielectric structure and a four-layered ground layer structure.

The three-layer dielectric structure comprises a first dielectric E1, a second dielectric E2, and a third dielectric E3. The second dielectric E2 is located parallel apart from the upper surface of the first dielectric E1, while the third dielectric E3 is placed parallel apart from the bottom surface of the first dielectric E1.

The four-layered ground layer structure comprises a first ground layer 400 formed on the upper surface of the first dielectric E1, a second ground layer 500 formed on the bottom surface of the first dielectric E1, a third ground layer 600 on the second dielectric E2, and a fourth ground layer 700 on the bottom surface of the third dielectric E3.

On the other hand, the first ground layer 400 and the bottom surface of the second dielectric E2 are bonded to each other through the first bonding sheet B1, while the second ground layer 500 and the upper surface of the third dielectric E3 are bonded by a bonding sheet B2.

Also, the flexible circuit board having improved bending durability according to an embodiment of the invention may include a via hole VH filled with a conductor material. A via hole VH filled with a conductor in a hole passing through the first E1 to the third dielectric E3, and the first ground layer 400 to the fourth ground layer 700, and the first bonding sheet B1 and the second bonding sheet B2, in order to enable to be conductive and connected electrically.

A signal line 800 is disposed on the first dielectric E1, and a pair of the first bonding sheet B1 are spaced apart from each other with the signal line 800 therebetween, so that the inner space formed by the second dielectric E2 and the first bonding sheet B1. Accordingly, it is preferable that the signal line 800 is located in this inner space. That is, since the signal line 800 is located in the inner space and exposed to the air layer having a low dielectric constant ($\varepsilon=1.0005$), the flexible circuit board can reduce the line loss in the signal line 800. As described above, it is preferable that the shape of the first bonding sheet B1 is a square, for example a "☐" shape, in order to prevent outer material from introducing through its both ends.

As shown in FIGS. 4 to 6, it is preferable that a plurality of ground holes GH is formed at a regular distance from each other in the third ground layer 600. The gap between the second ground layer 500 and the fourth ground layer 700 is preferably larger than the gap between the first ground layer 400 and the third ground layer 600.

The flexible circuit board according to an embodiment of the invention may prevent an external signal from being introduced using the fourth ground layer 700. Also, it is possible to satisfy the characteristic impedance of the signal line 800 adjusted to about 50Ω by using the fourth ground layer 700 and the third ground layer 600 having the plurality of ground holes GH, as well as to reduce the line loss and thickness thereof.

As shown in FIGS. 7 and 8, the gap between the second ground layer 500 and the fourth ground layer 700 and the gap between the first ground layer 400 and the third ground layer 600 may be controlled by adjusting the thickness of the second dielectric E2 and the third dielectric E3. In this case, the thickness of the third dielectric E3 is preferably 1.5 times or more the thickness of the second dielectric E2.

Provided that the thickness of the third dielectric E3 is increased, the signal line 800 can be formed thicker and the line loss can be reduced at transmitting the signals.

In addition, the second dielectric E2 can be made thinner, and the thickness of the flexible circuit board can be reduced, by forming the ground hole GH in the third ground layer 600.

As shown in FIGS. 2 and 3, the second substrate part 200 of the enhanced bending durable flexible circuit board according to an embodiment of the invention may exclude at least one of the third ground layer 600 and the fourth ground layer 700 of the second substrate part 200.

For example, the second substrate part 200 comprises a first dielectric E1, a second dielectric E2, a third dielectric E3, a first ground layer 400, and a second ground layer 500. The third ground layer 600 and the fourth ground layer 700 are selectively applied or not applied to the first substrate part 100 in order that the second substrate part 200 is made to be thinner than the first substrate part 100.

The third substrate part 300 may be formed thinner than the second substrate part 200 by excluding at least of two selected from the group consisting of the second dielectric E2, the third dielectric E3, the third ground layer 600 and the fourth ground layer 700.

As the first substrate part 100, the second substrate part 200 and the third substrate part 300 are sequentially thinned, it is possible to prevent stress concentration at a specific portion due to a sudden change in thickness, and the flexible circuit board according to an embodiment of the invention has an advantage that bending durability is highly improved.

The flexible circuit board with improved bending durability according to an embodiment of the invention may comprise a first protective sheet C1 and a second protective sheet C2. The first protective sheet C1 and the second protective sheet C2 are made of a poly-based resin such as polyimide or an epoxy-based resin. The first protective sheet C1 and the second protective sheet C2 are interposed between the first E1 and second dielectrics E2, the first dielectric E1 and third dielectric E3, respectively, and are connected to or overlap with the first bonding sheet (B1) and the second bonding sheet (B2), respectively.

In the flexible circuit board with improved bending durability according to an embodiment of the invention, the first substrate part 100 includes a first dielectric E1 on which a first ground layer 400 is deposited, and a second dielectric E2 on which a third ground layer 600 facing the upper surface of the second substrate part 200 is deposited. The second substrate part 200 is thinner than the first substrate part 100, and a first dielectric E1 extending from the first substrate part 100.

The flexible circuit board with improved bending durability may further comprise a first protective sheet C1. A portion of the first protective sheet C1 may be interposed between the first dielectric E1 and the second dielectric E2 and the other portion may extend along the direction in which they extend.

The flexible circuit board with improved bending durability further includes a third dielectric E3 corresponding to the second dielectric E2 about the first dielectric E1. Here, a fourth ground layer 700 may be stacked on the third dielectric E3.

The flexible circuit board having improved bending durability may further include a second protective sheet C2 having a portion thereof interposing between the first dielectric E1 and the third dielectric E3, and the other portion extends along the direction in which the first dielectric E1 extends.

A flexible circuit board according to an embodiment of the invention includes a third ground layer 600, a second dielectric E2, a first protective sheet C1, a first ground layer 400.

The third substrate part 300 may be made by cutting, with blade or laser beam or the like, a second dielectric E2 on the upper surface of the first dielectric E1 and a third dielectric E3 on the bottom surface of the first dielectric E1. In this case, the first protective sheet C1 is introduced between the second dielectric E2 and the first ground layer 400 so as to be connected or overlapped at one end of the first bonding sheet B1, and the other end is formed so as to protrude further than the end of the second dielectric E2 in the direction of the signal line.

The second protective sheet C2 is interposed between the third dielectric E3 and the second ground layer 500 such that the second protective sheet C2 is connected to one end of the second bonding sheet B2 or at least partially overlaps the second protective sheet C2. The other end of the second protective sheet C2 is formed so as to protrude further in the signal line direction than one end of the third dielectric E3.

Here, the second ground layer 500 may correspond to the first ground layer 400 around the first dielectric E1.

Therefore, since the protective sheets C1 and C2 protect the signal line 800, the first ground layer 400, and the second ground layer 500 from the blade, laser, or the like used for cutting, the first ground layer 400 and the second ground layer 500 are prevented from being damaged, and unnecessary carbide formation is prevented during cutting.

The first protective sheet C1 is coated with a thermosetting adhesive on its bottom surface so as to be fixed between the second dielectric E2 and the first ground layer 400. The thermosetting adhesive can be applied only to the surface except the surface exposed to the outside by cutting the second dielectric E2. In addition, the first bonding sheet B1 may be extended on the upper surface of the first protective sheet C1 so that at least a part thereof overlaps with the first protective sheet C1 without applying a thermosetting adhesive.

The second protective sheet C2 may be coated with a thermosetting adhesive on its upper surface so as to be fixed between the third dielectric E3 and the second ground layer 500, and the coating with the adhesive applied except the surface exposed to the outside by cutting the third dielectric E3. In addition, the second protective sheet C2 may be formed so that the second bonding sheet B2 is extended and overlapped with the second protective sheet C2 without applying the thermosetting adhesive.

Meanwhile, a pair of the first bonding sheet B1 forms forming an inner space to be defined by installing spaced apart from each other by a regular distance between a pair of the signal lines 800, and the inner space is made by the first dielectric E1, the second dielectric E2, and the first bonding sheet B1. Thereby the first bonding sheet B1 is provided with an inner space forming groove H.

Figure 9:
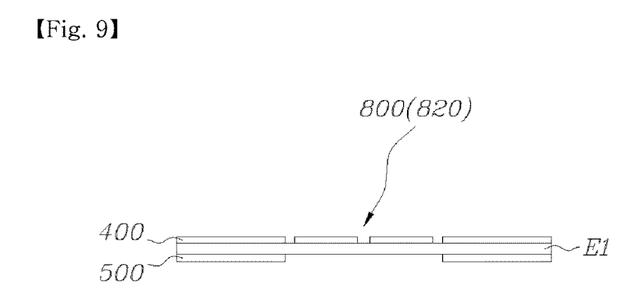
FIG. 9 is a view showing a first embodiment of a flexible circuit board.

Hereinafter, various embodiments of the third substrate part will be described. FIG. 9 is a view showing a first embodiment of a third substrate part 300 which is a part of the invention. As shown in FIG. 9, the third substrate part 300 may include a first dielectric E1, a signal line 800 stacked on the first dielectric E1, and a pair of first ground layers 400 stacked on the first dielectric E1 and spaced apart from each other by a regular distance between the signal lines, a pair of second ground layers 500 stacked on the bottom of the first dielectric E1 and spaced apart from each other by a regular distance. In this case, signal lines 800 may include a first signal line 810 and a pair of parallel second signal lines 820 branched from the first signal line 810.

Figure 10:
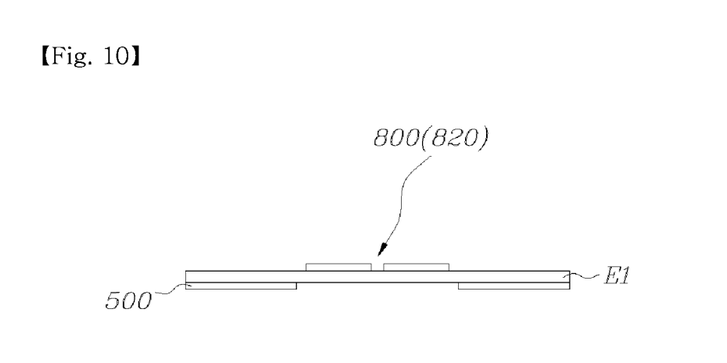
FIG. 10 is a view showing a second embodiment of a third substrate part which is one of the substantial parts of a flexible circuit board.

FIG. 10 is a view showing a second embodiment of the third substrate part 300 of the invention. As shown in FIG. 10, the third substrate part 300 may include a first dielectric E1, a signal line 800 stacked on the first dielectric E1, and a pair of second ground layers 400 stacked on bottom surface of the first dielectric E1 and spaced apart from each other by a regular distance. In this case, signal lines 800 may include a first signal line 810 and a pair of parallel second signal lines 820 branched from the first signal line 810.

Figure 11:
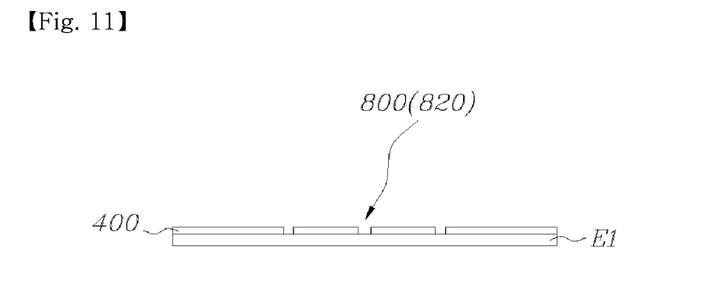
FIG. 11 is a view showing a third embodiment of a third substrate part which is one of the substantial parts of a flexible circuit board.

FIG. 11 is a view showing a third embodiment of the third substrate part 300 of the invention. As shown in FIG. 11, the third substrate part 300 may include a first dielectric E1, a signal line 800 stacked on the first dielectric E1, and a pair of first ground layers 400 stacked on the first dielectric E1 and spaced apart from each other by a regular distance. In this case, signal lines 800 may include a first signal line 810 and a pair of parallel second signal lines 820 branched from the first signal line 810.

Figure 12:
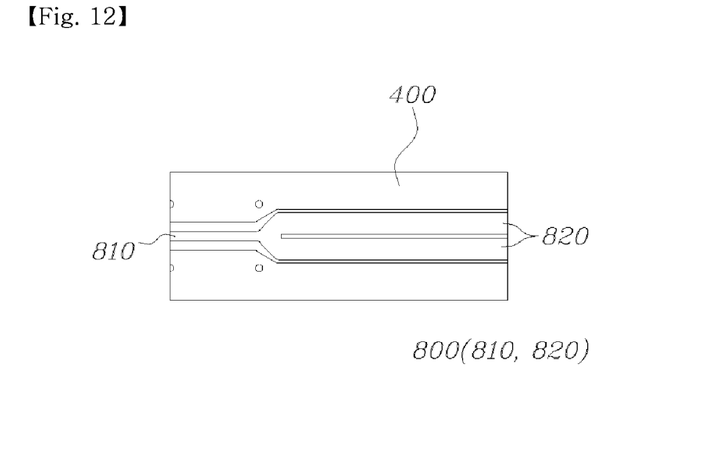
FIG. 12 is a view showing an upper part of a third substrate part which is one of the substantial parts of the flexible circuit board according to the first embodiment and the third embodiment.

As shown in FIG. 12, in case of a first and third embodiment of the third substrate part 300 of the invention, the gap between the outer side of the second signal line 820 and inner side of the first ground layer may be thinner than one end of the first signal line 810 and inner side of the first ground layer 400.

Figure 13:
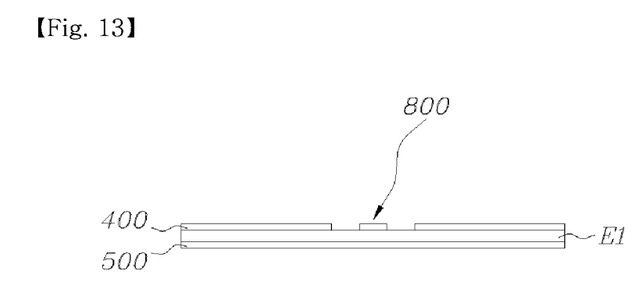
FIG. 13 is a view showing fourth and fifth embodiments of a third substrate part which is one of the substantial parts of a flexible circuit board.

FIG. 13 is a view showing fourth and fifth embodiments of the third substrate part 300 of the invention. In addition, FIG. 14 is a view showing a second ground layer 500 of the third substrate part 300 in the fourth embodiment of the invention.

Figure 14:
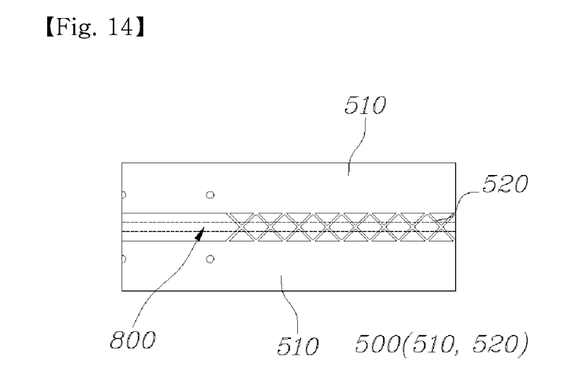
FIG. 14 is a view showing a structure of a second ground layer in a fourth embodiment of a third substrate part which is one of the substantial parts of a flexible circuit board.

As shown in FIGS. 13 and 14, the third substrate part 300 in the fourth embodiment may include a first dielectric E1, a signal line 800 stacked on the first dielectric E1, a pair of first ground layers 400 stacked on the first dielectric E1 and spaced apart from each other by a regular distance between the signal lines 800, and the second ground layer 500 on the bottom surface of the first dielectric E1. In this case, the second ground layer 500 may include a pair of line grounds 510, which is formed apart from each other on the both side of the signal line 800, and a mesh ground 520 to make a connection with a pair of ground 510. Meanwhile, in the fifth embodiment of the third substrate part 300 of the invention, the second ground layer 500 is made of silver paste.

While the present invention has been particularly shown and described with reference to exemplary embodiments thereof, it is to be understood that the invention is not limited to the flexible circuit board according to the invention, and it will be apparent to those skilled in the art that variations and modifications may be made without departing from the scope of the present invention.

It will be understood by those skilled in the art that various changes in form and details may be made therein without departing from the spirit and scope of the invention as defined by the attached claims.

INDUSTRIAL AVAILABILITY

The invention provides a flexible circuit board and its manufacturing method improved in bending durability without restriction of the install position in a wireless terminal and having improved bending durability that prevents signal line and ground damages during the manufacturing process, so that the invention may be used industrial field.

What is claimed is:

1. A flexible circuit board having enhanced bending durability comprising:
   a first substrate part including a first dielectric, a second dielectric facing an upper surface of the first dielectric, a first ground layer stacked on the first dielectric, and a third ground layer stacked on the second dielectric;
   a second substrate part extending from one end of the first substrate part and excluding the third ground layer from the first substrate part so that the second substrate part is thinner than the first substrate part;
   a third substrate part extending from one end of the second substrate part and excluding the second dielectric from the second substrate part so that the third substrate part is thinner than the second substrate part;
   a first bonding sheet bonding the first ground layer and the second dielectric; and
   a first protective sheet, one end of the first protective sheet interposed between the second dielectric and the first ground layer to connect to one end of the first bonding sheet or overlap at least a part of the first bonding sheet, and other end of the first protective sheet protruding further in a signal line direction than one end of the second dielectric.

2. The flexible circuit board of claim 1,
   wherein the first substrate part further comprises a third dielectric facing a bottom surface of the first dielectric, a fourth ground layer stacked on a bottom surface of the third dielectric, and a second ground layer stacked on the bottom surface of the first dielectric;
   wherein the second substrate part is formed by excluding the fourth ground layer from the first substrate part;
   wherein the third substrate part is formed by excluding the third dielectric from the second substrate part; and
   wherein the third substrate part further comprises a second bonding sheet for bonding the second ground layer and the third dielectric, and a second protective sheet, one end of the second protective sheet connected to one end of the second bonding sheet or interposed between the third dielectric and the second ground layer such that at least a part of the second bonding sheet overlaps, and other end of the second protective sheet protruding further in the signal line direction than one end of the third dielectric.

3. The flexible circuit board of claim 2, further comprising:
   a signal line provided on the first dielectric,
   wherein a pair of the first bonding sheets form an inner space defined by the first dielectric, the second dielectric, and the first bonding sheets, being spaced apart from each other by a predetermined distance, and the signal line is located in the inner space.

4. The flexible circuit board of claim 3, further comprising:
   a via hole formed by passing through the first dielectric to the third dielectric, the first ground layer to the fourth ground layer, and the first bonding sheet to the second bonding sheet in order to electrically connect from the first ground layer to the fourth ground layer; and
   a plurality of ground holes formed and spaced apart from each other by a predetermined distance in the third ground layer.

5. The flexible circuit board of claim 4,
   wherein a gap between the second ground layer and the fourth ground layer is larger than a gap between the first ground layer and the third ground layer.

6. The flexible circuit board of claim 2,
   wherein the third ground layer, the second dielectric, the first protective sheet, and the first ground layer are formed in a stepped structure, and
   wherein the fourth ground layer, the third dielectric, the second protective sheet, and the second ground layer are formed in a stepped structure.

* * * * *